United States Patent [19]

Ogura

[11] Patent Number: 4,686,280

[45] Date of Patent: Aug. 11, 1987

[54] POSITIVE TYPE RESIST MATERIAL WITH TRIMETHYLSILYLNITRILE

[75] Inventor: Ken Ogura, Tokyo, Japan

[73] Assignee: Oki Electric Industry Co., Ltd., Tokyo, Japan

[21] Appl. No.: 727,395

[22] Filed: Apr. 25, 1985

[30] Foreign Application Priority Data

Apr. 26, 1984 [JP] Japan .................................. 59-82836

[51] Int. Cl.$^4$ ................................................ G03C 1/60
[52] U.S. Cl. .................................. 430/190; 430/191; 430/192
[58] Field of Search ....................... 430/190, 192, 191

[56] References Cited

U.S. PATENT DOCUMENTS

3,615,538 10/1971 Peters et al. ......................... 430/196
4,164,421 8/1979 Shinozaki et al. ................... 430/191
4,524,196 1/1985 Farnham et al. ................. 525/330.3

FOREIGN PATENT DOCUMENTS

1367830 9/1974 United Kingdom ................ 430/331

OTHER PUBLICATIONS

Moran, J. M., et al., *Bell Systems Tech. Journal*, vol. 58, No. 5, 5-6/1979, pp. 1027-1036.

Ting, C. H. et al., "Multilayer Strategy for High Resolution Lithography", Intel Corp. NVW Tech. Development, pp. 139-149, CA95051.

*Primary Examiner*—Charles L. Bowers, Jr.
*Attorney, Agent, or Firm*—Wenderoth, Lind & Ponack

[57] ABSTRACT

A positive type resist material with high oxygen plasma resistance and a process for forming high resolution resist patterns using the resist material are disclosed. The positive type resist material comprises a photoactive resin, an organic solvent, and 5 to 50% by weight of trimethylsilylnitrile.

A compound of a phenol resin having phenolic hydroxyl groups and a photoactive compound, or phenol-formaldehyde is used as an example of the photoactive resin. As the solvent, selected from the group consisting of 1,2-ethoxyl acetate, methyl ethyl ketone, xylene, and n-butyl acetate are used alone or in combination. The process for forming high resolution resist patterns comprises steps of forming a first resist layer for planarizing a wafer surface, forming a second resist layer on the first resist layer by using the above mentioned positive type resist material, forming patterns on the second resist layer by exposing the second resist layer to the exposure energy and developing, and transferring the patterns on the second resist layer to the first resist layer and the wafer by reactive ion etching using the second resist layer as an etching mask.

16 Claims, 6 Drawing Figures

POSITIVE TYPE RESIST MATERIAL WITH TRIMETHYLSILYLNITRILE

BACKGROUND OF THE INVENTION

1. Field of the Invention

The present invention relates to a positive type resist material with high oxygen plasma resistance and a process for forming high-resolution resist patterns.

2. Description of the Related Art

Recently, a single layer resist structure has been replaced by a multilayer resist structure to meet the requirement for forming high-resolution patterns. Bilayer and trilayer resist processes are discussed in "MULTI-LAYER STRATEGY FOR HIGH RESOLUTION LITHOGRAPHY" by C. H. Ting, I. Vigal and B. C. Lu, Intel Corporation, NVW Technology Development, pp. 139–149, CA 95051. Also, the trilayer resist process is discussed in "High-Resolution, Steep Profile, Resist Patterns", by J. M. Moran and D. Maydan, American Telephone and Telegraph Company, The Bell System Technical Journal Vol. 58, No. 5, May–June 1979, pp. 1027–1036. The bilayer resist process requires two photolithographic steps and the two resist layers tend to peel easily from each other. For this reason the trilayer resist process has been widely used.

In the trilayer resist structure, three layers are composed of a first resist layer for planarizing a wafer surface, a second resist layer consisting of inorganic film or metal film with plasma-resistance, and a third resist layer consisting of photo sensitive resist film. The third resist layer is firstly patterned by way of developing, the second resist layer is then patterned by using the third resist layer as a mask, and finally the first (bottom) resist layer is patterned by a method of reactive ion etching (R.I.E.) with the second and the third resist layers used as etching masks. These three layers are needed due to lack of photoactive resist materials which if used alone do not provide a sufficient oxygen plasma-resistance.

Therefore, the trilayer resist process has an advantage in forming high resolution patterns, but has disadvantages in its complexity and lower throughput.

SUMMARY OF THE INVENTION

It is therefore an object of the present invention to provide a new positive type resist material with high oxygen plasma resistance and a process for forming high resolution resist patterns employing a bilayer resist process with high productivity, high economy and less production steps.

The positive type resist material according to the present invention consists essentially of a photoactive resin, 5 to 50% by weight of trimethylsilylnitrile, and an organic solvent. As an example of the photoactive resin, a compound of a phenol resin having phenol hydroxyl groups and a photoactive compound, which undergoes a photolysis reaction when irradiated with exposure beams, can be used. Phenolformaldehyde can also be used as another example of the photoactive resin. as the organic solvent, at least one member selected from the group consisting of 1,2-ethoxyethyl acetate, methyl ethyl ketone, xylene, and n-butyl acetate can be used. This positive type resist material exhibits oxygen plasma resistance, and provides excellent resolution. According to the present process, high resolution patterns can be formed with less production steps by using the positive type resist material of the present invention.

According to the present invention, the process for forming resist patterns comprises the steps of forming a first resist layer for planarizing a wafer surface; forming a second resist layer on the first resist layer by using a positive type resist material consisting essentially of a photoactive resin, 5 to 50% by weight of trimethylsilylnitrile, an organic solvent, wherein said first resist layer has a higher plasma etchrate than the second resist layer; forming patterns on the second resist layer by exposing the second resist layer to the exposure energy and developing; and transferring the patterns on the second resist layer to the first resist layer and the wafer by reactive ion etching using the second resist layer as an etching mask.

The above objects, features and advantages of the present invention will become more apparent from the following description when taken in conjunction with the accompanying drawings in which the preferred embodiment of the present invention are shown by way of an illustrative example.

DETAILED DESCRIPTION OF THE PREFERRED EMBODIMENTS

Figure 1A:
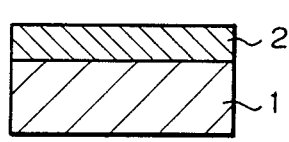
FIGS. 1(a)–(d) are sectional views each showing a process for forming a positive resist pattern according to the present invention.
Figure 1B:
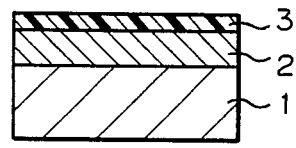

According to this invention, a positive resist material is obtained by incorporating into a photoactive base material solution an additive of 5 to 50% by weight, based on the total weight of the solid content of the base material solution.

The base material solution, for example, is obtained by dissolving in an organic solvent a photoactive resin which comprises a 1:2.5–3.0 ratio by weight of a phenol resin having phenolic hydroxyl groups in a naphthoquinone diazido sulfonic acid derivative as a photoactive compound.

As the organic solvent, 1,2-ethoxyethyl acetate, methylethyl ketone, xylene, and n-butyl acetate are used alone or in combination.

A trimethylsilylnitrile is used as the additive to improve the resistance characteristics of the positive resist material.

Also, a phenolformaldehyde ester can be used as the photoactive resin. In this case, the base material solution is made by dissolving the phenolformaldehyde ester in an organic solvent.

Furthermore, "AZ1350J", "AZ1470" (both are manufactured by HOECHST AG.), "MP1400" (is manufactured by SHIPLEY CO. INC.) "KPR820" (is manufactured by KODAK AG.), "HPR206" (is manufactured by HUNT CHEMICAL CORP.), "CFP800" or "ONPR830" (both are manufactured by TOKYO-OHKA-KOGYO CO.) can be used as the base material solution, and is available on the market.

A conventional photoresist material, for example, has an etchrate of 2000 to 3000 Å/min. to the attack of oxygen plasma, but an improved resist material according to this invention exists an etchrate of less than 500 Å/min.

The resist material according to this invention has a high resistance characteristics against oxygen plasma, and is suitable for using as a resist material of the second layer in the bilayer resist patterning process.

EXAMPLE I

According to this example, phenolformaldehyde resins of the following formula:

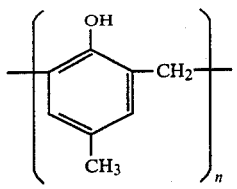

wherein the molecular weight n is 4, 15 or 16, and a photoactive compound of the following formula:

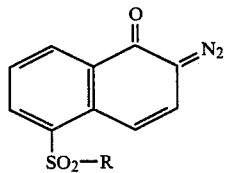

wherein R is a compound having hydroxyl groups, were prepared at a weight ratio of 1 to 2.5–3.0. Both of the substances functions as a photoactive resin, and were dissolved with an organic solvent to obtain a photoactive base material solution.

As the organic solvent, 1,2-ethoxyethyl was used. Then, to the solution thus obtained is added a trimethylsilylnitrile of 5 to 50% by weight, based on the total weight of the solid content of the solution (the phenolformaldehyde resin, the photoactive compound, and trimethylsilylnitrile), and mixed uniformly to obtain an improved positive resist solution. The compound may be in a condition that the additive is partially chemically reacted with the base material solution.

To examine the characteristics of the resist material according to this example, a resist film was formed on a wafer by spin-coating the resist material, and baked at about 50° C. for about 30 minutes. This baked wafer was exposed to ultraviolet rays, and then dip developed with a developing solution (alkali diluted solution) for 1 minute. Thus, a positive pattern was obtained on the wafer, the pattern was 0.7 um lines and spaces.

The resist film baked was subjected to a reactive ion etching in an oxygen atomsphere to examine the etching rate. In this test, the molecular weight n, for example, 4, 15 or 16, of the phenolformaldehyde resin was selected as a parameter.

Figure 2:
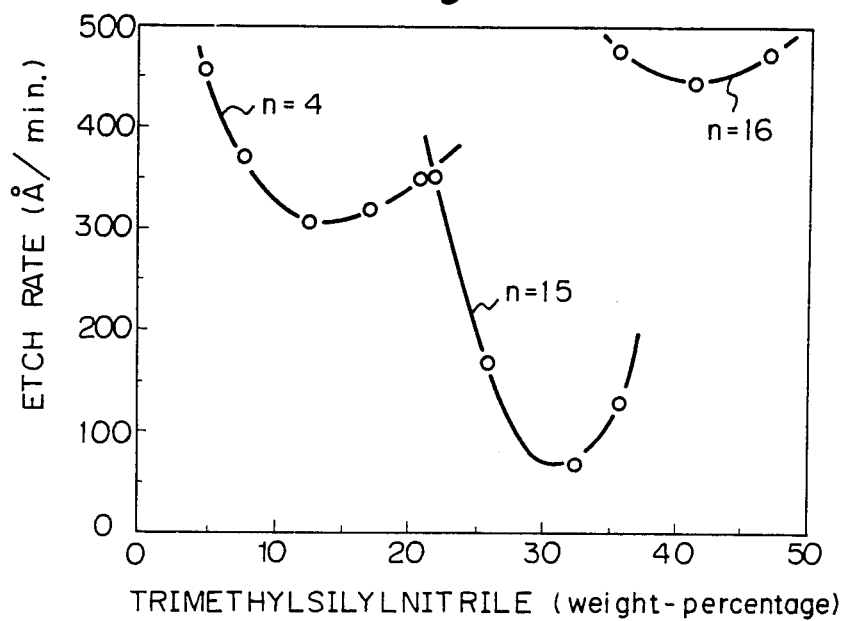
FIG. 2 is a graphic representation indicating the etchrates of the positive type resist materials according to the example I.

As shown in FIG. 2, when the molecular weight of phenolformaldehyde resin was 4, the resist film containing the additive of 5 to 21% by weight showed an etchrate of 300 to 450 Å/min.

Also, when the molecular weight of phenolformaldehyde resin was 15, the etchrate of the resist film was 50 to 350 Å/min. in the range of the additive of 22 to 35% by weight.

Furthermore, when the molecular weight of the phenolformaldehyde resin was 16, the resist film showed an etchrate of 450 to 470 Å/min. in the range of 35 to 47% by weight of the additive.

EXAMPLE II

In the second example according to this invention, phenolfolmaldehyde esters having the following formula:

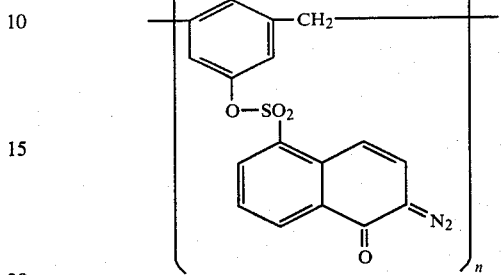

wherein n is the molecular weight, were prepared as a photoactive resin material. The photoactive resin was dissolved with xylene to obtain a photoactive base material. Then, to the solution obtained was added a trimethylsilylnitrile in an amount of 5 to 50% by weight based on the total weight of the solid content of the solution (the phenolformaldehyde ester and trimethylsilylnitryle), and mixed uniformly.

The resist materials having a molecular weight of 3, 50,000 or 100,000 were tested in respect to their resistance against oxygen plasma. the resist film was formed on a wafer by spin-coating the resist material of this invention, and baked at about 50° C. for about 30 minutes to harden.

This baked wafer was exposed to ultraviolet rays, and then dip developed with developing solution (alkali diluted solution) for 1 minute. Thus, a positive pattern was obtained on the wafer, the pattern was 0.7 μm lines and spaces.

Figure 3:
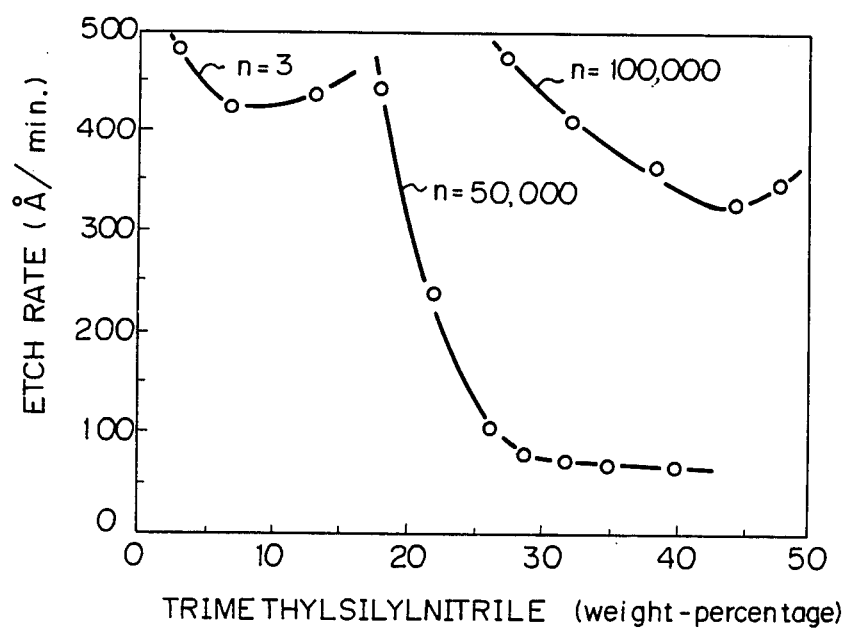
FIG. 3 is a graphic representation indicating the etchrate of the positive type resist material according to the example II.

The etching rates of the resist material hardened are shown in FIG. 3.

As shown in FIG. 3, when the molecular weight of the phenolformaldehyde ester was 3, the resist film containing the additive in amounts of 2 to 13% by weight showed an etchrate of 420 to 480 Å/min.

Also, when the molecular weight of the phenolformaldehyde ester was 50,000, the etchrate of the resist film was 70 to 400 Å/min. when the additive was used in an amount of 18 to 40% by weight.

Furthermore, when the molecular weight of the phenolformaldehyde ester was 100,000, the resist film showed a etchrate of 450 to 470 Å/min. when the additive was used in a range of 28 to 48% by weight.

EXAMPLE III

In the third example according to this invention, an ultraviolet rays reaction type positive resist material available on the market is prepared as a photoactive base material. For example, it was possible to use as the base material "AZ1350J" (manufactured by HOECHST AG.), "AZ1470" (manufactured by HOECHST AG.), "MP1400" (manufactured by SHIPLEY CO. INC.), "KPR820" (manufactured by KODAK AG.), "HPR206" (manufactured by HUNT CHEMICAL CORP.), "CFPR800" "CFPR800" (manufactured by TOKYO-OHKA-KOGYO CO., "ONPR830" (manufactured by TOKYO-OHKA-KOGYO CO.), or the like. To the base material solution was added a trimethylsilylnitrile of 5 to 50% by weight, based on the total weight of the solid content of the solution, and uniformly mixed.

The resist material obtained was subjected to the same test as that of Example I. As a result, the resist material according to this invention exhibited high resistance against oxygen ions.

A fine line structure can be obtained by using the resist material according to this invention.

Figure 1C:
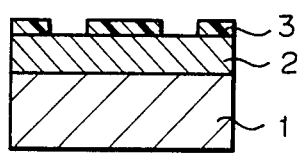

In FIG. 1(a) a first resist film 2 of a conventional resist material having a thickness of 2 to 5 μm is formed on a wafer 1, and baked at about 150° C. for about 30 minutes. Then, a resist film 3 of the resist material according to this invention was spin-coated in a thickness of 0.5 to 1 μm, and was exposed to ultraviolet rays, electron beams or ion beams to transfer a desired pattern thereon. The structure obtained above is immersed in a photographic developer (for example, a conventional alkaline etchant) for about one minute to form a mask pattern, as shown in FIG. 1(c).

Figure 1D:
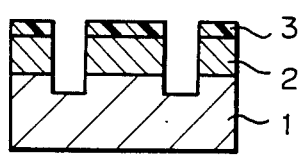

The structures obtained above was subjected to a reactive ion etching process in an oxygen plasma atomosphere to remove the first resist film 2 by using the second resist film 3 as an etching mask, as shown in FIG. 1(d). In sequence, the wafer 1 is selectively etched in an $F_2$ plasma by using both the resist films 2 and 3 as a two-layer mask to form openings therein. Since the resist material according to this invention can provide an improved resistance against the attack of oxygen ions, an intermediate film of metal or silicon oxide used in the trilayer resist patterning process is completely eliminated.

Therefore, a fine structure can be obtained with reduced manufacturing steps, low cost, and good workability.

The invention may be embodied in other specific forms without departing from the spirit or essential characteristics thereof. The present embodiment is therefore to be considered in all respect as illustrative and not restrictive, the scope of the invention being indicated by the appended claimed rather than by the foregoing description and all changes which come within the meaning and range of equivalency of the claimed are therefore intended to be embraced therein.

What is claimed is:

1. A positive type resist material consisting essentially of a mixture of
   a photoactive resin having phenolic hydroxyl groups selected from the group consisting of an admixture of a naphthoquinone diazide sulfonic acid derivative compound and a phenol formaldehyde, and an ester of the reaction of a naphthoquinone diazide sulfonic acid derivative compound and a phenol formaldehyde;
   5 to 50% by weight of trimethylsilylnitrile based on the solid content of the positive resist material; and
   an organic solvent.

2. A positive type resist material as claimed in claim 1, in which said photoactive resin is an admixture of the compound and phenol formaldehyde.

3. A positive type resist material as claimed in claim 2, in which said phenol formaldehyde and said compound in the admixture is present in a weight ratio of 1 to 2.5–3.0.

4. A positive type resist material as claimed in claim 2, in which said phenol formaldehyde is a phenol formaldehyde resin of the following formula:

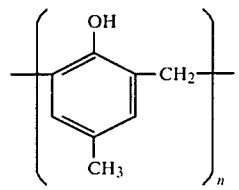

wherein n is an integer from 4 to 16.

5. A positive type resist material as claimed in claim 2, in which said compound is a naphthoquinone diazido sulfonic acid derivative of the following formula

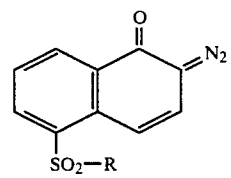

wherein R is a compound having hydroxyl groups.

6. A positive type resist material as claimed in claim 1, in which said photoactive resin is a phenol formaldehyde ester of the following formula:

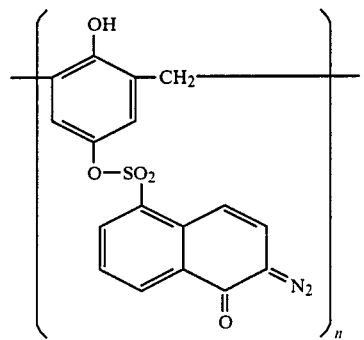

wherein n is an integer from 3 to 100,000.

7. A positive type resist material as claimed in claim 1, in which said organic solvent is at least one member selected from the group consisting of 1,2-ethoxyethyl acetate, methylethyl ketone, xylene, and n-butyl acetate.

8. A positive type resist material as claimed in claim 1, in which said trimethylsilylnitrile is present in an amount of 30 to 35% by weight.

9. A positive type resist material as claimed in claim 2, in which said exposure beams are selected from the group consisting of ultraviolet rays, ion beams and electron beams.

10. A positive type resist solution consisting essentially of a mixture of
    a base material solution forming a positive resist pattern, said base material solution being composed of a photoactive resin having phenolic hydroxyl groups selected from the group consisting of an admixture of a naphthoquinone diazide sulfonic acid derivative compound and a phenol formaldehyde, and an ester of the reaction of a naphthoquinone diazide sulfonic acid derivative compound and a phenol formaldehyde and an organic solvent; and 5 to 50% by weight of trimethylsilylnitrile based on the total weight of the solid content of the positive type resist solution.

11. A positive type resist solution as claimed in claim 10, in which said photoactive resin is admixture of the compound and the phenol formaldehyde.

12. A positive type resist solution as claimed in claim 11, in which said phenol formaldehyde and said compound in the admixture is present by a weight ratio of 1 to 2.5-3.0.

13. A positive type resist solution as claimed in claim 11, in which said phenol formaldehyde is a phenol formaldehyde resin of the following formula:

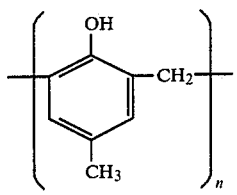

wherein n is an integer from 4 to 16.

14. A positive type resist solution as claimed in claim 10, in which said photoactive resin is a phenolformaldehyde ester of the following formula:

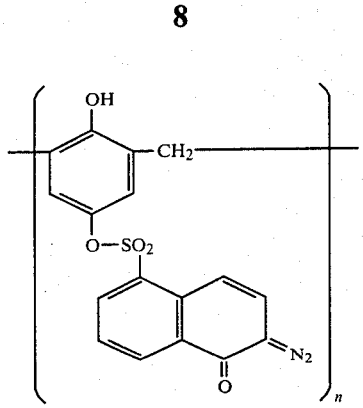

wherein n is an integer from 3 to 100,000.

15. A positive type resist solution as claimed in claimed 10, in which said organic solvent is at least one member selected from the group consisting of 1,2-ethoxyethyl acetate, methylethyl ketone, xylene, and n-butyl acetate.

16. A positive type resist solution as claimed in claim 11, in which said compound is a naphthoquinone diazido sulfonic acid derivative of the following formula:

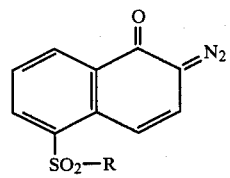

wherein R is a compound having hydroxyl groups.

* * * * *